United States Patent
Ida et al.

(10) Patent No.: US 6,521,955 B1
(45) Date of Patent: Feb. 18, 2003

(54) SEMICONDUCTOR DEVICE INCLUDING MEMORY CELLS AND MANUFACTURING METHOD THEREOF

(75) Inventors: Jiro Ida, Tokyo (JP); Naoko Nakayama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/671,210

(22) Filed: Sep. 28, 2000

(30) Foreign Application Priority Data

Apr. 19, 2000 (JP) .......................... 2000-117991

(51) Int. Cl.[7] .............................................. H01L 29/72
(52) U.S. Cl. ...................... 257/382; 257/383; 257/384; 257/532
(58) Field of Search ................................ 257/382, 384, 257/383, 532

(56) References Cited

U.S. PATENT DOCUMENTS 6,130,463 A * 10/2000 Oda et al. .................. 257/384

FOREIGN PATENT DOCUMENTS

| JP | 05183117 | 7/1993 |
|----|----------|--------|
| JP | 07161826 | 6/1995 |
| JP | 08046057 | 2/1996 |
| JP | 08186179 | 7/1996 |
| JP | 09027555 | 1/1997 |
| JP | 09283643 | 10/1997 |
| JP | 10242420 | 9/1998 |
| JP | 10270572 | 10/1998 |
| JP | 11017129 | 1/1999 |

* cited by examiner

Primary Examiner—Edward Wojciechowicz
(74) Attorney, Agent, or Firm—Volentine Francos, PLLC (57) ABSTRACT

In a semiconductor device having memory cells and peripheral circuits, the memory cells and the peripheral circuits are formed on a semiconductor substrate. Source regions, drain regions and gate electrodes of MOS transistors in the peripheral circuits are comprised of a refractory metallic silicide layer. Gate electrodes of MOS transistors in the memory cells are comprised of the refractory metallic silicide. Source and drain regions of the MOS transistors in the memory cells are not comprised of the refractory metallic silicide layer.

11 Claims, 12 Drawing Sheets

SEMICONDUCTOR DEVICE INCLUDING MEMORY CELLS AND MANUFACTURING METHOD THEREOF

The present application claims priority under 35 U.S.C. §119 to Japanese Application No. 2000-117991 filed on Apr. 19, 2000, which is hereby incorporated by reference in its entirely for all purposes.

BACKGROUND OF THE INVENTION

1. Field of the Invention

The present invention relates to a semiconductor device and method of manufacture, and particularly, the present invention relates to a semiconductor device having memory cells and peripheral circuits which control the memory cells, and to a method of manufacturing such a semiconductor device.

2. Description of the Related Art

Semiconductor devices have been rapidly developing in which memory cells and peripheral circuits controlling the memory cells are formed in the same semiconductor substrate. Particularly, significant developments have been made in the area of systematic semiconductor devices which include a function of a semiconductor memory circuit, such as a dynamic random access memory (DRAM) and a function of a logic circuit.

Metal oxide semiconductor (MOS) transistors of such logic circuit have been employed to improve the driving ability of an electric current. Silicide layers are formed on gate electrodes, source regions and drain regions of the MOS transistors using a Self-Aligned Silicide (Salicide) method. Thereby, a resistance of the gate electrode and the source and drain regions is reduced and the logic circuit is capable of a high speed operation is.

Also, MOS transistors of the memory cells, particularly of the DRAM, must be capable of required to realize a high speed operation in order to transfer large amounts of data, such as image data. To realize such a high speed operation, it has been proposed to form silicide layers on the gate electrodes, source regions and drain regions of MOS transistors in the memory cells.

However, in the MOS transistor of the memory cells of the DRAM, concentrations of impurities in the source regions and the drain regions are set to low levels to restrain a short channel effect, to slacken a concentration of an electrical field in the drain region and to maintain a retention time. Therefore, junctions between the source regions or the drain regions and the semiconductor substrate are formed in the vicinity of a surface of the semiconductor substrate.

Consequently, if the silicide layers are formed on the gate electrodes, source regions and the drain regions of the MOS transistors in the memory cells of the DRAM, a high speed operation could be realized, but leak current from the source and drain regions to the semiconductor substrate would increase.

The silicide layers of the MOS transistors of the memory cells are simultaneously formed in the same step of forming the silicide layers of the MOS transistors of the peripheral circuits. Here, a method of forming an insulating layer, such as a nitride layer on the MOS transistors of the memory cells can be considered so as to avoid formation of the silicide layer on the MOS transistors of the memory cells. So, as it is impossible to form the silicide layers on the gate electrodes of the MOS transistors of the memory cells, an access time of the memory cells may be increased. Therefore, it is difficult to realize a high speed operation of the DRAM.

SUMMARY OF THE INVENTION

An object of the present invention is to provide a semiconductor device including peripheral circuits and memory cells which are capable of realizing a high speed operation while securing a predetermined data-retention-time.

To achieve the object, in a semiconductor device having memory cells and peripheral circuits which control the memory cells, wherein the memory cells and the peripheral circuits are formed on a semiconductor substrate, source regions, drain regions and gate electrodes of MOS transistors in the peripheral circuits are comprised of a refractory metallic silicide layer. Gate electrodes of MOS transistors in the memory cells are comprised of the refractory metallic silicide and source and drain regions of the MOS transistors in the memory cells are not comprised of the refractory metallic silicide layer.

According to the present invention, a semiconductor device can be realized which includes peripheral circuits and memory cells which are capable of a high speed operation while securing a predetermined data-retention-time.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood. In this description, one embodiment is shown in which the present invention is applied to a semiconductor device including a DRAM(Dynamic Random Access Memory). In these embodiments, a semiconductor substrate has a p type conductivity, and MOS transistors in peripheral circuits and memory cells are a n type conductivity. However, other conductivities can be selected, for example, by use of wells.

Figure 1:
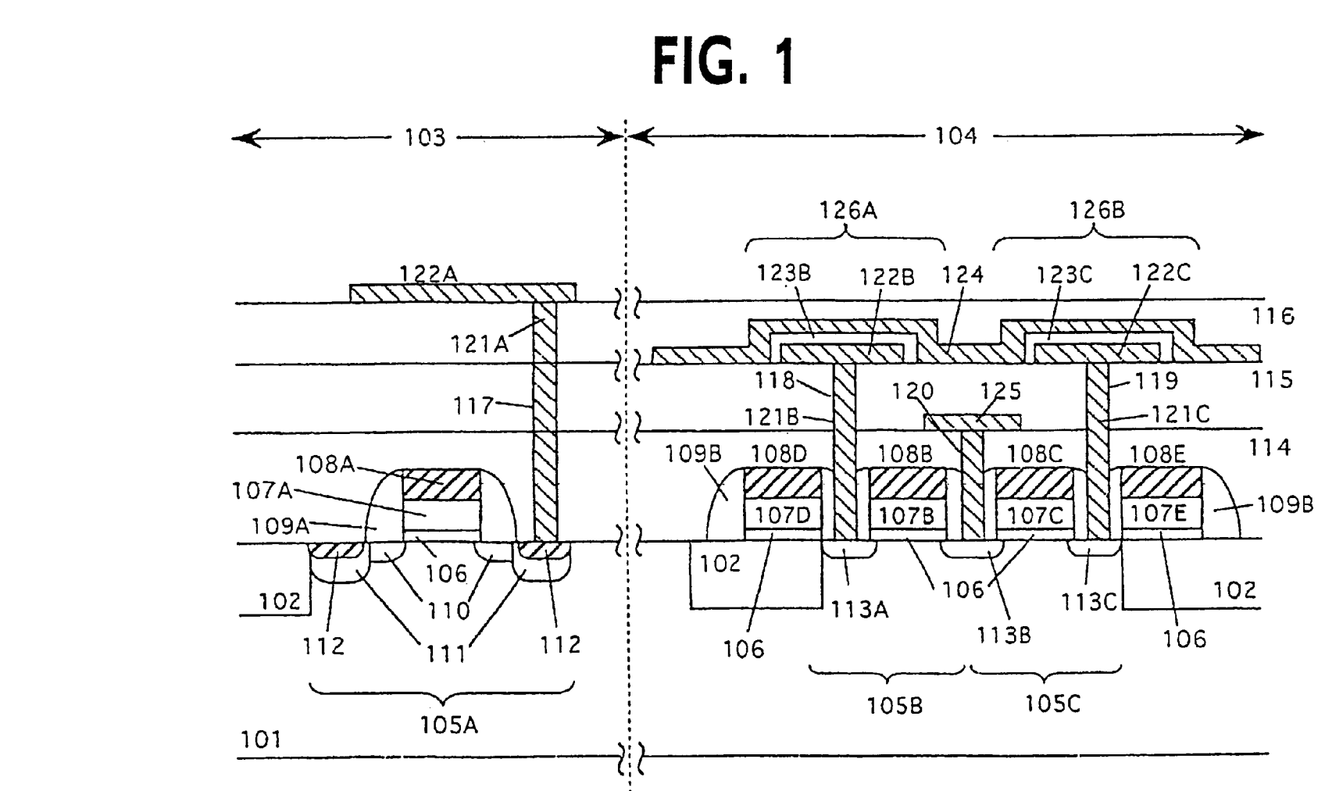
FIG. 1 is a cross-sectional view describing a semiconductor device according to a first preferred embodiment.

FIG. 1 is a cross-sectional view describing a memory cell of the DRAM according to a first preferred embodiment.

A semiconductor substrate 101 having a p type conductivity is comprised of a monocrystal silicon. Insulating layers 102 for isolation from element regions are formed on a surface of the semiconductor substrate 101. Also, field insulating layers which are formed by a LOCOS (Local Oxidation of Silicon) method can be used as the insulating layers 102. The surface of the semiconductor substrate 101 is divided in a plurality of element regions 103, 104 by the insulating layers 102.

N channel type MOS (NMOS) transistors 105B, 105C which comprise memory cell transistors in memory cells of the DRAM, are formed in the element region 104. A NMOS transistor 105A which controls the transistors in the memory cell, such as the NMOS transistors 105B, 105C, is formed in the element region 103. Here, the element region 103 is defined as a peripheral circuit region and the element region 104 is defined as a memory cell region. In the peripheral region 103, plural logic circuits which output linear signals and control the transistors in the memory cell region, are formed therein.

First, the NMOS transistor 105 in the peripheral circuit region 103 will be described hereinafter.

A gate electrode of the NMOS transistor 105 is comprised of a crystalline silicon layer 107A which is doped with an impurity, such as phosphorus, and a refractory metallic silicide layer 108A. The refractory metallic silicide layer 108A is a silicide layer which is a combination of silicon and a refractory metal, such as cobalt (Co), titanium (Ti) and tungsten (W) and silicon. In this embodiment, the refractory metallic silicide layer 108A is $CoSi_2$, $TiSi_2$ or $WSi_2$. That is, the gate electrode is a polyside structure which includes the refractory metal. A gate oxide layer 106 is formed under the polycrystalline silicon layer 107A.

A source region and a drain region are comprised of a N type impurity region 110 in which a N type impurity is lightly doped, and a N type impurity region 111 in which a N type impurity is heavily doped. Such a structure is called a LDD (Lightly Doped Drain) structure. Also, an Extension structure can be used which includes a N type impurity region 110' which is doped heavily instead of the N type impurity region 110. The N type impurity region 110' has a shallow junction.

The N type impurity region 110 is formed by an ion implantation method which implants phosphorus into the semiconductor substrate 101 at $4 \times 10^{13}$ $cm^{-3}$. The N type impurity regions 111 is formed by the ion implantation method which implants arsenic into the semiconductor substrate 101 at $2 \times 10^{15}$ $cm^{-3}$.

In the Extension structure, the N type impurity region 110 is implanted with arsenic into the semiconductor substrate 101 at $4 \times 10^{14}$ $cm^{-3}$. The N type impurity region 111 is implanted with the arsenic into the semiconductor substrate 101 at $2 \times 10^{15}$ $cm^{-3}$.

Similar to the gate electrode, refractory metallic silicide layer 112 is formed on surfaces of the source and drain regions. The refractory metallic silicide layer 112 is a silicide layer which is a combination of silicon and a refractory metal, such as cobalt (Co), titanium (Ti) and tungsten (W). In this embodiment, the refractory metallic silicide layer 112 is $CoSi_2$, $TiSi_2$ or $WSi_2$.

A side wall 109A which is comprised of an oxide or a nitride, is formed on the side of the gate electrode to form the LDD structure.

Next, the NMOS transistors 105B and 105c of the memory cells will be described.

Gate electrodes of the NMOS transistor 105B and 105C are respectively comprised of crystalline silicon layers 107B and 107c and refractory metallic silicide layers 108B and 108C. The refractory metallic silicide layers 108B and 108C are silicide layers which are a combination of silicon and a the refractory metal, such as cobalt (Co), titanium (Ti) and tungsten (W) and silicon. In this embodiment, the refractory metallic silicide layers 108B and 108C are $CoSi_2$, $TiSi_2$ or $WSi_2$. That is, the gate electrodes are a polyside structure which includes the refractory metal. The gate oxide layer 106 is formed under the polycrystalline silicon layer 107B and 107C.

Impurity regions 113A, 113B and 113C are source or drain regions of the NMOS transistors 105B or 105C, and these are n type impurity regions. The impurity regions 113B is shared with the NMOS transistors 105B and 105C.

These N type impurity regions 113A–113C are formed by an ion implantation method which implants arsenic (As) into the semiconductor substrate 101 at $1 \times 10^{14}$ $cm^{-3}$.

These impurity regions 113A–113C are formed at a shorter depth than the impurity regions 111 of the peripheral circuit region 103 as shown by the cross section view of FIG. 1. That is, the impurity region 113A–113C are smaller than the impurity regions 111.

Gate electrodes of the next NMOS transistors are formed on the insulating layer 102 in the vicinity of the gate electrodes of the NMOS transistors 105B and 105C. The gate electrodes of the next NMOS transistors are comprised of the gate oxide layer 106, polycrystalline silicon layers 107D and 107E and refractory metallic silicide layers 108D and 108E. Side walls 109B which are comprised of an oxide or a nitride, are formed on sides of the NMOS transistors in the memory cells.

A first intermediate insulating layer 114, a second intermediate insulating layer 115 and a third intermediate insulating layer 116 which are comprised of a silicon oxide, are formed on the peripheral circuit region 103 and the memory cell region 104.

A contact hole 117 is formed in the peripheral circuit region 103. The contact hole 117 goes through the first, second and third intermediate insulating layers 114, 115, 116. That is, the contact hole 117 is formed between the refractory metallic silicide layer 112 of the source or drain region and a surface of the third intermediate insulating layer 116. A buried conductive layer 121A, such as tungsten (W) is filled into the contact hole 117. A conductive line 122A which is connected to the buried conductive layer 121A, is formed on the third intermediate insulating layer 116. The conductive line 122A is connected to another MOS transistors (not shown) in the peripheral circuit region 103.

Contact holes 118, 119 are formed in the memory cell region 104. The contact holes 118, 119 go through the first and second intermediate insulating layers 114 and 115. That is, the contact holes 118, 119 are formed between the source or drain regions 113A, 113C and a surface of the second intermediate insulating layer 115. Further, a contact hole 120 is formed in the memory cell region 104. The contact hole 120 goes through the first intermediate insulating layer 114. That is, the contact hole 120 is formed between the source or drain regions 113B and a surface of the first intermediate insulating layer 114. A conductive layer is filled into the contact hole 120 and is connected to a bit line 125 which is provided with data from the memory cell. Buried conductive layers 121B and 121C, such as polycrystalline layers, are filled into the contact hole 118, 119.

Storage electrodes 122B and 122C which are comprised of polycrystalline, are formed on the second intermediate insulating layer 115 and are respectively connected to the impurity regions 113A, 113C through the buried conductive layers 121B, 121C.

Dielectric layers 123B, 123C, such as nitride layers, are formed on the storage electrodes 122B, 122C so as to cover the storage electrodes. Cell plate electrode 124 is formed on the dielectric layers 123B, 123C.

Capacitors 126A, 126B store charges as data and read out the data to the bit line 125 through the MOS transistors 105B, 105C. Also, data is written in the capacitors 126A, 126B from the bit line 125 through the MOS transistors 105B, 105C. A passivating film (not shown) covers the semiconductor substrate 101.

According to the first preferred embodiment, as refractory metallic silicide layers are formed on the gate electrode and the source and drain regions of the MOS transistor in the peripheral circuit region, a resistance of the gate electrode and the source and drain regions is reduced and the peripheral circuit thus is capable of a high speed operation.

Further, as a refractory metallic silicide layer is formed only on the gate electrode of the MOS transistor in the memory cell region, that is, such a silicide layer is not formed on the source or drain region, leakage from the source or drain region to the substrate is reduced and a predetermined data-retention-time can be secured. Further, as a resistance of the gate electrode of the MOS transistor in the memory cell region is reduced by the refractory metallic silicide layer, an access time can be shortened.

If an oxide which has smaller stress, as compared with the nitride, is applied to the side wall 109B in the memory cell, leakage which is caused by stress from the side wall can be reduced.

A method of manufacturing the semiconductor device described above, will be shown hereinafter referring to FIG. 2(A)–FIG. 2(G). In this embodiment, elements which correspond to the elements mentioned above are marked with the same symbols to facilitate understanding.

Figure 2A:
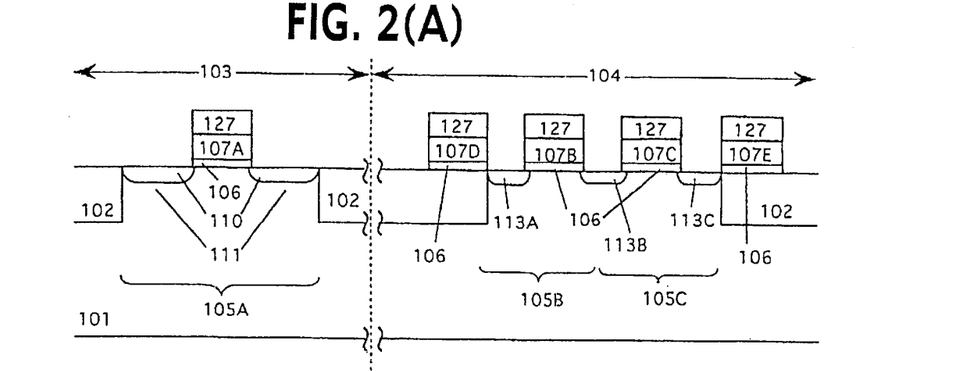
FIG. 2(A)–FIG. 2(G) are cross-sectional views describing a method of manufacturing the semiconductor device shown in FIG. 1.

As shown in FIG. 2(A), insulating layers 102 are formed on a semiconductor substrate 101. These insulating layers can be formed by a LOCOS (Local Oxidation of Silicon) method. Thereby, a surface of the semiconductor substrate 101 is divided into a peripheral circuit region 103 and a memory cell region 104. An oxide layer is formed on the surface of the semiconductor substrate by a thermal treatment. Then, a polycrystalline silicon layer and a silicon nitride layer are formed on the oxide layer. Then, a gate oxide layer 106, polycrystalline silicon layers 107A . . . 107E and a silicon nitride layer 127 are formed by a photolithography technique.

Then, a n type conductive impurity, such as phosphorus, is introduced into a surface of the semiconductor substrate 101 in the peripheral circuit region 103 and the memory cell region 104 at $4 \times 10^{13}$ cm$^{-3}$ using the gate oxide layer 106, the polycrystalline silicon layers 107A . . . 107E and the silicon nitride layer 127 as a mask. Then, a heat treatment is carried out. The n type conductive impurity is diffused by the heat treatment. N type impurity regions 110, 113A . . . 113C are formed by this diffusion. In this embodiment, the impurity region 110 is formed so as to be wider than the impurity regions 113A . . . 113C. In the case where the NMOS transistor 105 which has the Extension structure is formed, arsenic is introduced into the semiconductor substrate 101 at $4 \times 10^{14}$ cm$^{-3}$.

An insulating layer, such as a silicon oxide, is deposited in the peripheral circuit region and the memory cell region at a thickness which is more than half of a distance between gate electrodes of the MOS transistors 105B and 105C. In this embodiment, as the distance between the gate electrodes of the MOS transistors 105B and 105C is 0.3 μm, the thickness of the insulating layer is equal to or more than 0.15 μm. Similarly, distances between the gate electrodes of the MOS transistors 105B or 105C and the next MOS transistors are 0.3 μm.

Figure 2B:
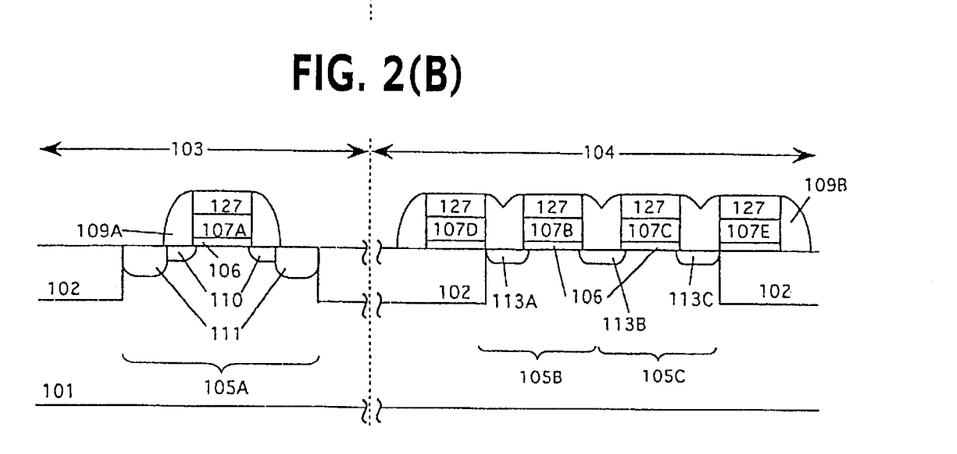

Then, the insulating layer is etched by an anisotropic etching technique. Side walls 109A are formed on the side of the gate oxide layer 106, the poly-crystalline silicon layer 107A and the silicon nitride layer 127, and side walls 109B are formed on the side of the gate oxide layer 106, the poly-crystalline silicon layers 107B . . . 107E and the silicon nitride layers 127.

As the insulating layer is deposited at a thickness which is more than half of a distance between the gate electrodes of the MOS transistors 105B and 105C, the n type impurity regions 113A . . . 113C in the memory cell region 104 are covered by the side walls 109B, as shown in FIG. 2(B). As the impurity regions 110 in the peripheral circuit region 103 are formed so as to be wider than the impurity regions 113A . . . 113C in the memory cell region, portions of the impurity regions 110 are exposed, as shown in FIG. 2(B). Then, the n type conductive impurity, such as arsenic, is introduced into a surface of the impurity region 110 which is exposed from the side walls 109A in the peripheral circuit region 103 at $2 \times 10^{15}$ cm$^{-3}$. Then, a heat treatment is carried out. The n type conductive impurity is diffused by the heat treatment. The n type impurity regions 111 are formed by this diffusion. Thus, an LDD structure can be formed which has a lightly doped impurity region and a heavily doped impurity region.

Figure 2C:
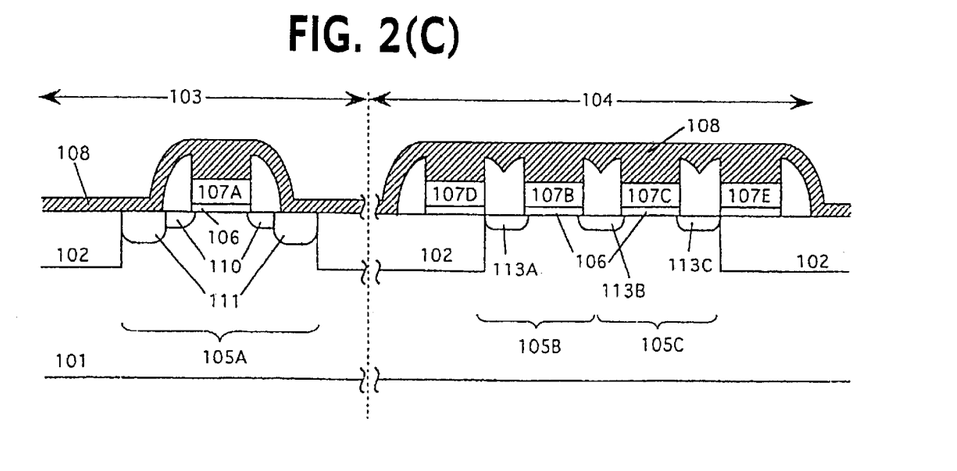
Figure 2D:
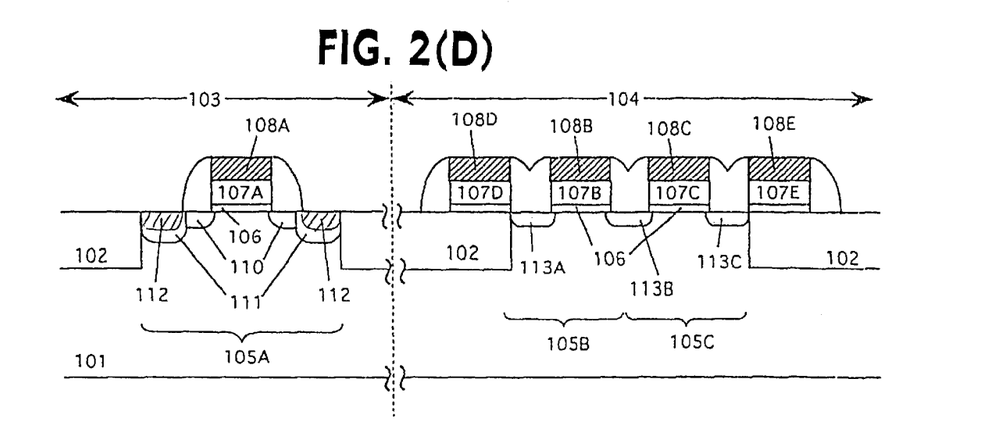

Then, the silicon nitride layers 127 are removed by a selective etching technique, as shown in FIG. 2(C). A refractory metal layer 108, such as cobalt (Co), titanium (Ti), tungsten (W), is deposited on the semiconductor substrate 101. Here, the refractory metal layer 108 is reacted with the polycrystalline silicon layers 107A . . . 107E and the heavily doped impurity region 111 by a saliside (Self Aligned Silicide) method, as shown in FIG. 2(D). The refractory metallic silicide layers 112, 108A . . . 108E, such as CoSi$_2$, TiSi$_2$ or WSi$_2$, are formed on the impurity regions 111 and the polycrystalline silicon layers 107A . . . 107E. The impurity regions 113A . . . 113C in the memory cell region 104 do not react with the refractory metal layer 108 since the impurity regions are covered by the side walls 109B.

Figure 2E:
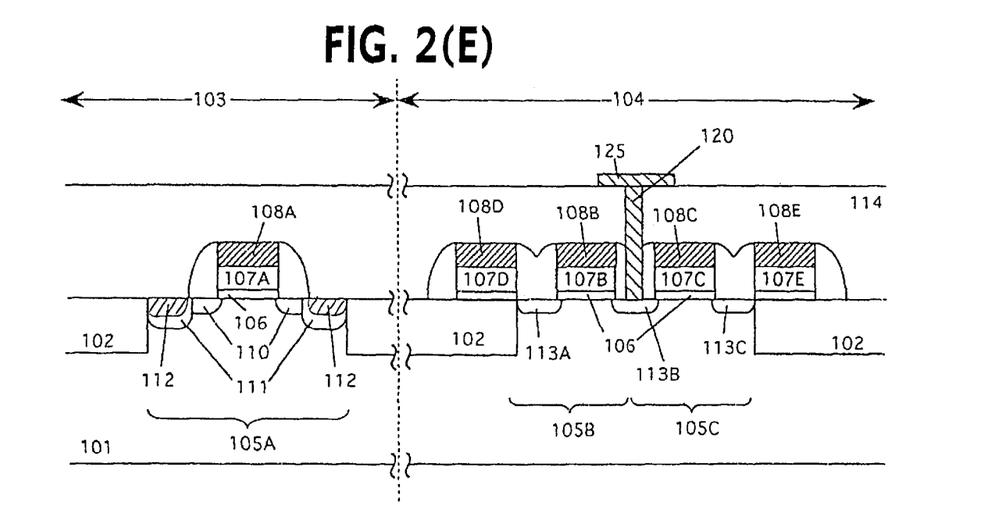

A first intermediate insulating layer 114 is formed on the semiconductor substrate 101, as shown in FIG. 2(E). A contact hole 120 is formed in the first insulating layer 114. The contact hole 120 reaches the impurity region 113B which is a source or a drain of the MOS transistors 105B and 105C. A conductive material is filled into the contact hole 120. A bit line 125 which is connected to the conductive material, is formed on the first insulating layer 114.

Figure 2F:
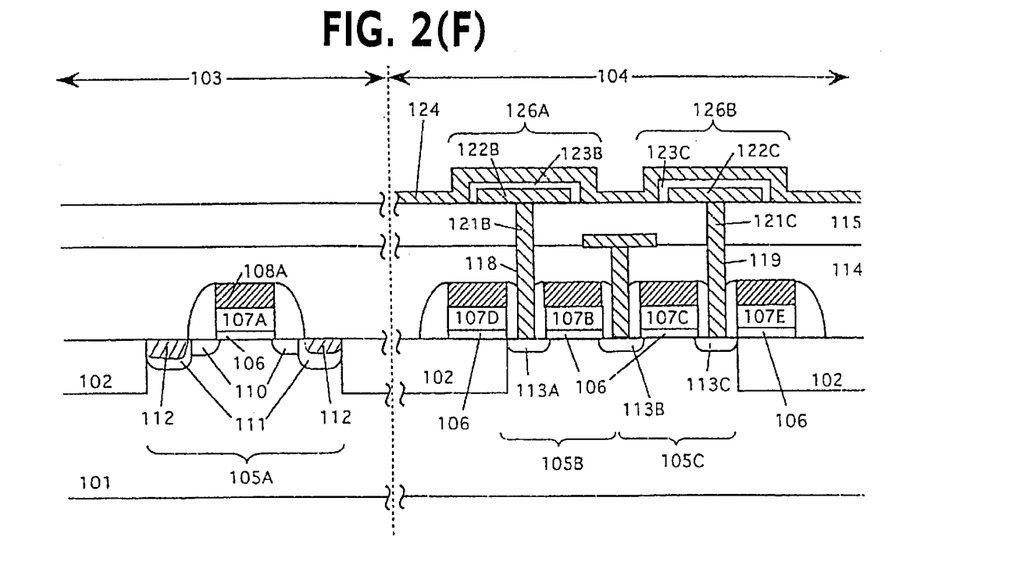

A second intermediate insulating layer 115 is formed on the first intermediate insulating layer 114 so as to cover the bit line 125, as shown in FIG. 2(F). Contact holes 118, 119 which reach the impurity region 113A, 113C (source or drain of the MOS transistors 105B, 105C), are formed in the first and second intermediate insulating layer 114, 115. Buried conductive layers 121B and 121C, such as polycrystalline silicon, are filled into the contact holes 118, 119. Then, storage electrodes 122B, 122C which are connected to the buried conductive layers 121B, 121C, are formed on the second insulating layer 115. Dielectric layers 123B, 123C, such as nitride layers, are formed on the storage electrode 122B, 122C. Cell plate electrode 124 is formed on the dielectric layer 123B, 123C. Thus, the capacitors 126A, 126B of the memory cell are formed.

Figure 2G:
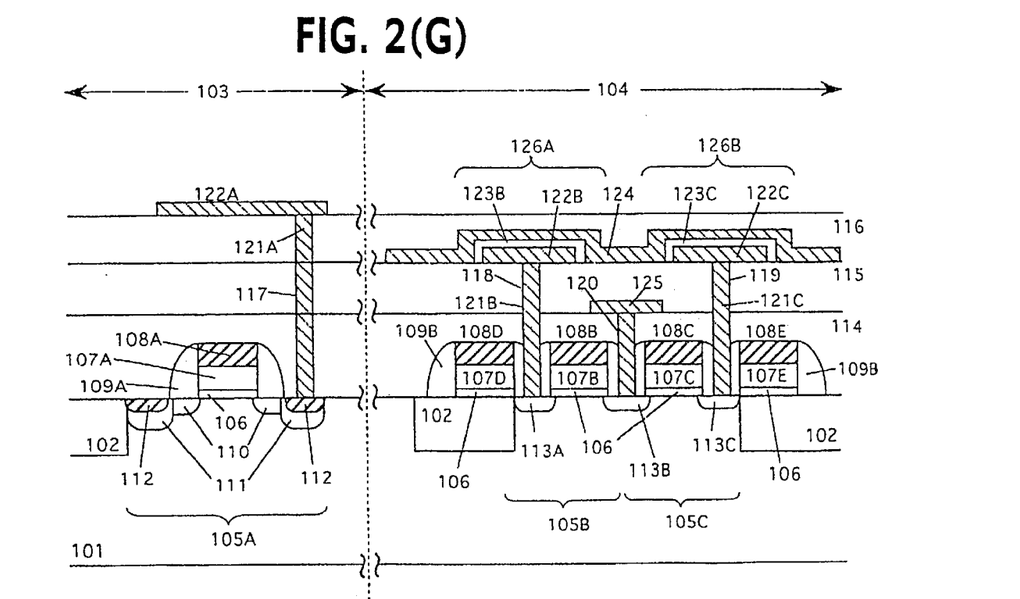

A third intermediate insulating layer 116 is formed on the second insulating layer 115 so as to cover the cell plate electrodes 124, as shown in FIG. 2(G). The contact hole 117 which reaches the refractory metallic silicide layer 112, is formed in the first, second and third intermediate insulating layers 114 . . . 116. The buried conductive layer 121A, such as tungsten (W), is formed in the contact hole 117. A conductive line 122A which is connected to the buried conductive layer 121A, is formed on the third insulating layer 116, as shown in FIG. 2(G).

Then, conductive lines (not shown) which connect the MOS transistors in the memory cell and/or the peripheral circuit with the MOS transistors in the peripheral circuit, are formed on the third insulating layer 116. Then, the passivating film (not shown) is formed on the third insulating layer 116.

According to this manufacturing method, when the side walls are formed in the peripheral circuit region, the impurity regions, which are sources or drains of the memory cell transistors in the memory cell region, are simultaneously covered with the side walls which are formed at once in the memory cell region. Therefore, the refractory metallic silicide layers can be formed on the gate electrodes, the source regions and the drain regions of the MOS transistors in the peripheral circuit region and the gate electrodes of the MOS transistors in the memory cell region. Moreover, the refractory metallic layers do not form on the source and drain regions of the MOS transistors in the memory cell region.

As a result, a semiconductor device including a peripheral circuit which is capable of a high speed operation and a memory cell which is capable of reducing leakage current and shortening an access time, can be realized.

A manufacture method of a second preferred embodiment will be shown hereinafter referring to FIGS. 3(A)–(F). Before the step of FIG. 3(A), steps similar to those of FIG. 2(A)–FIG. 2(B) are carried out. Elements which correspond to the elements mentioned above are marked with the same symbols to facilitate understanding.

Figure 3A:
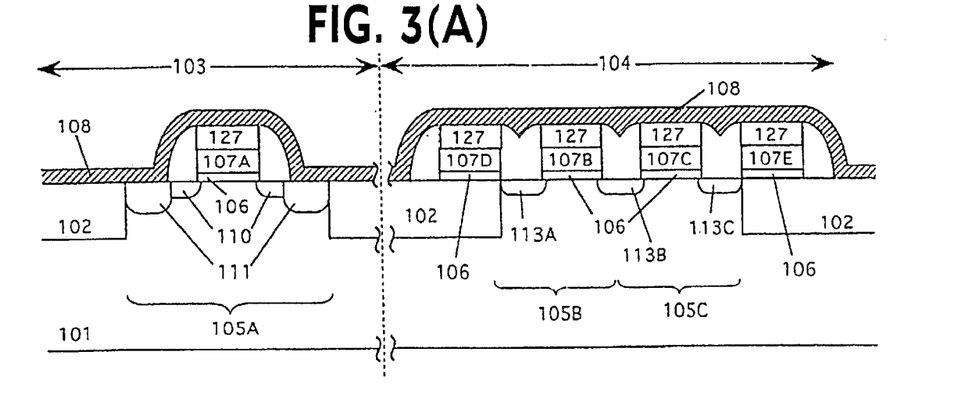
FIG. 3(A)–FIG. 3(E) are cross-sectional views describing a method of manufacturing according to a second preferred embodiment.

As shown in FIG. 3(A), a refractory metal layer 108, such as cobalt (Co), titanium (Ti) or tungsten (W), is formed on the semiconductor substrate 101.

Figure 3B:
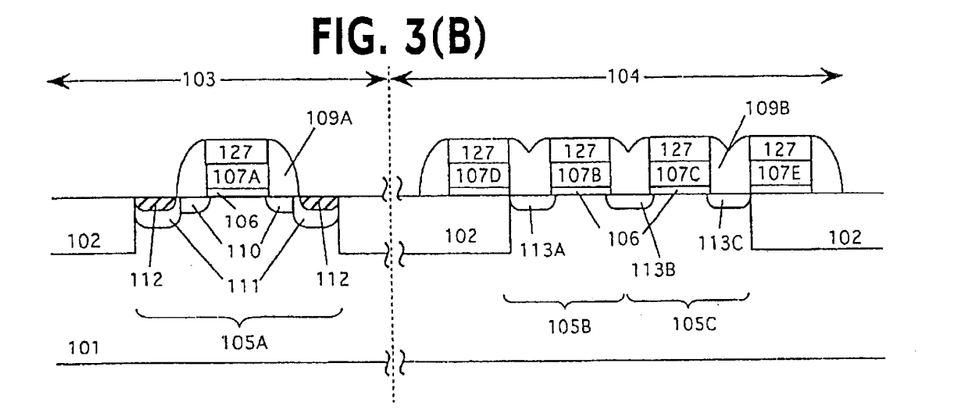

Then, the refractory metal layer 108 is reacted with heavily doped impurity regions 111 using the saliside (Self Aligned Silicide) method, as shown in FIG. 3(B). The refractory metallic silicide layers 112, such as $CoSi_2$, $TiSi_2$ or $WSi_2$, are formed on the impurity regions 111. Impurity regions 113A . . . 113C in a memory cell region 104 do not react with the refractory metal layer 108 since the impurity regions are covered by the side walls 109B. The refractory metal layer 108 on the side walls 109A, 109B, an insulating layer 102 and a silicon nitride layer 127 does not react by the saliside method and is removed therefrom.

Figure 3C:
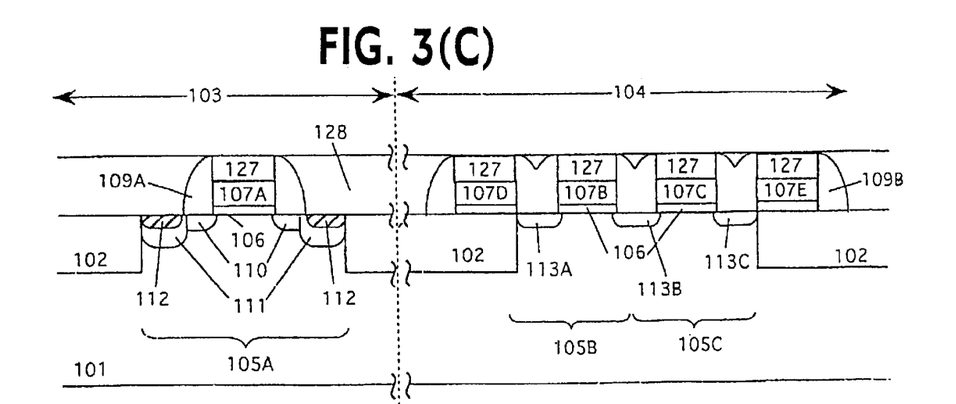

Then, a silicon oxide layer 128 is deposited on the semiconductor substrate 101 by a CVD (Chemical Vapor Deposition) method. The silicon oxide layer 128 is polished by a CMP (Chemical Mechanical Polishing) method or a back etching method so as to expose silicon nitride layers 127.

Figure 3D:
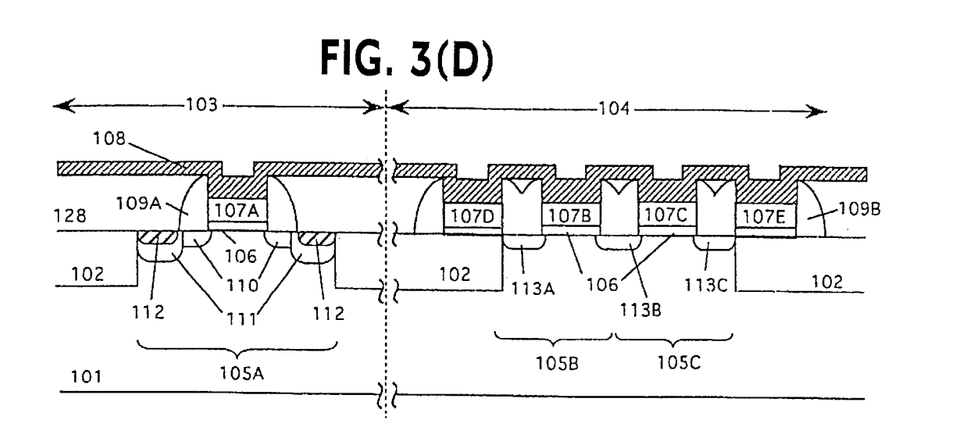
Figure 3E:
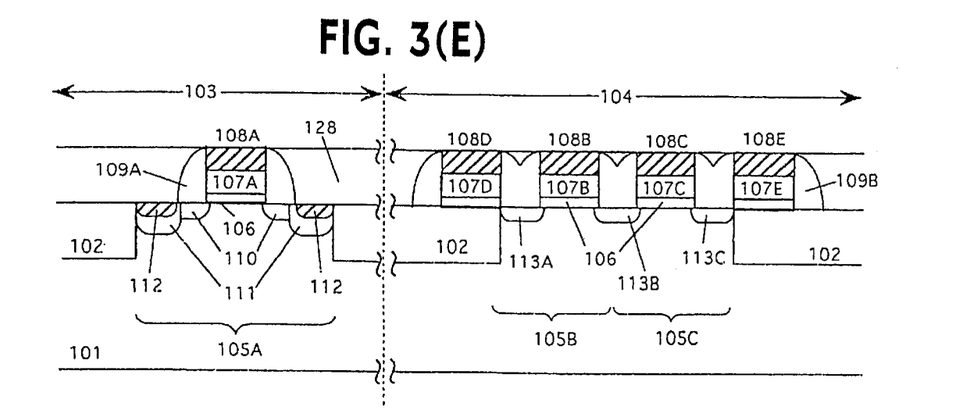

Then, the silicon nitride layers 127 are selectively removed and a refractory metal layer 108, such as cobalt, titanium or tungsten, is deposited on the substrate 101, as shown in FIG. 3(D). The refractory metal layer 108 is reacted with polycrystalline silicon layers 107A . . . 107E using the salicide method. Refractory metallic silicide layers 108A . . . 108E, such as $CoSi_2$, $TiSi_2$, or $WSi_2$, are formed on the polycrystalline silicon layers 107A . . . 107E. The remaining portions of refractory metal layer 108 deposited on a silicon oxide layer 128 are removed therefrom.

The silicon oxide layer 128 can be used as the first intermediate insulating layer 114 of the first preferred embodiment. Similar to the first preferred embodiment, the bit line, the capacitor, the conductive lines, etc. are formed on the silicon oxide layer 128.

According to the second embodiment, as the impurity regions in the peripheral circuit region are covered with the silicon oxide layer, when the silicon nitride layers are removed by etching, damage of the impurity regions in the peripheral circuit region from the etching can be avoided. As a result, characteristics of the MOS transistors in the peripheral circuit region become precise.

A manufacturing method of a third preferred embodiment will be shown hereinafter referring to FIGS. 4(A)–(F). Before the step of FIG. 4(A), steps similar to FIG. 2(A) are carried out. Elements which correspond to the elements mentioned above are marked with the same symbols to facilitate understanding.

Figure 4A:
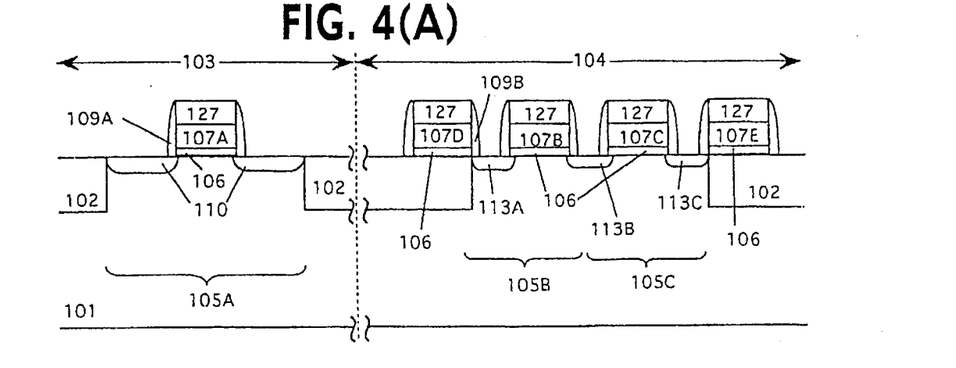
FIG. 4(A)–FIG. 4(F) are cross-sectional views describing a method of manufacturing according to a third preferred embodiment.

In this embodiment, side walls 109A, 109B which are thinner than that of the first preferred embodiment, are formed so as to expose portions of the impurity R regions 113A . . . 113C, as shown in FIG. 4(A). To form the thin side walls 109A, 109B, an insulating layer, such as a silicon oxide layer is deposited at 500 Å, and then the insulating layer is etched by anisotropic etching.

In the case where the thickness of the side walls 109A of the MOS transistor 105A in the peripheral circuit region 103 becomes thin, a parasitic resistance of the MOS transistor 105A can be reduced according to the MOS transistor including the LDD structure or the Extension structure.

Figure 4B:
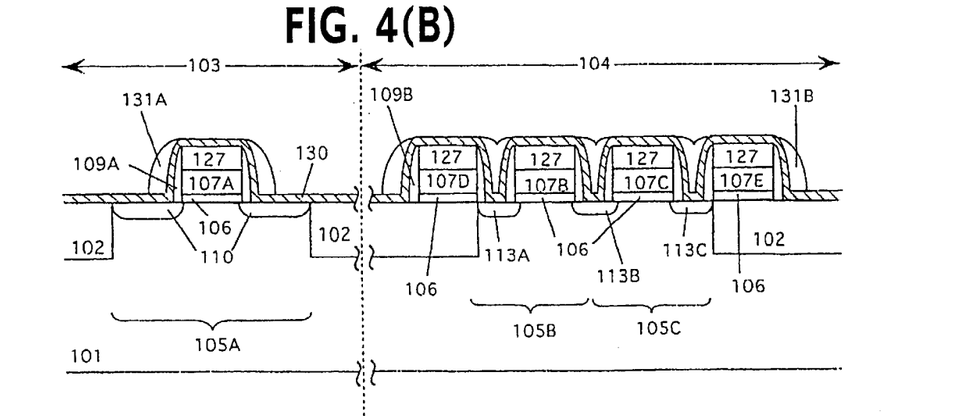

Then, a silicon nitride layer 130 is deposited on the substrate 110 at 100 Å, as shown in FIG. 4(B). A silicon oxide layer 131 is deposited on the substrate 101 at 1000 Å so as to cover the silicon nitride layer 130 on the impurity region 113B in the memory cell region 104. Then, the silicon oxide layer 131 1 is etched by anisotropic etching and second side walls 131A are formed in the peripheral region and second side walls 131B are formed in the memory cell region.

Figure 4C:
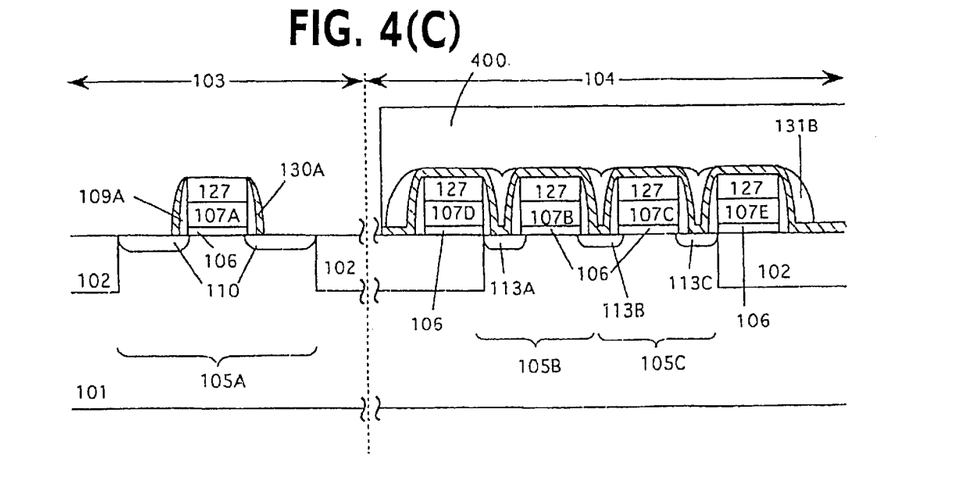

A resist layer 400 is formed on the MOS transistors 105B, 105C in the memory cell region, as shown in FIG. 4(C). Then, the second side walls 131A and the silicon nitride layer 130 are removed by selective etching such that the silicon nitride layer 130 remains on the first side walls 109A. The remaining silicon nitride layer becomes third side walls 130A. In the case where the silicon nitride layer is removed, as the selective etching etches only the silicon nitride layer, etching of the insulating layer 102 on the substrates 101 is avoided.

Figure 4D:
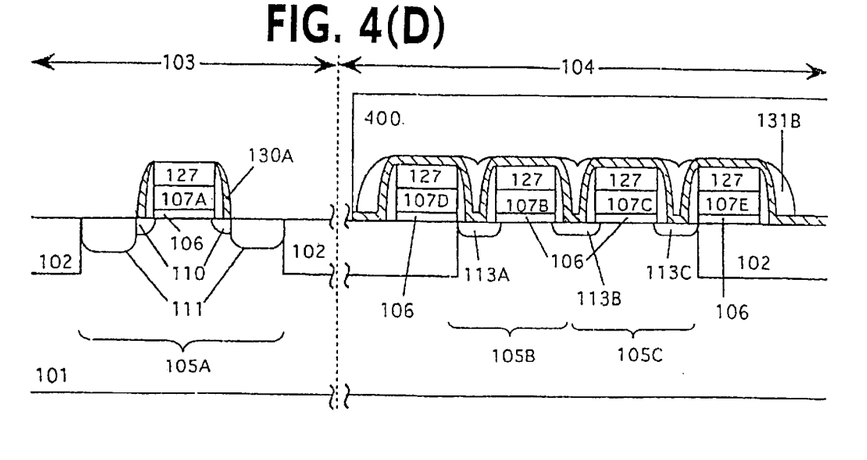

Then, the n type conductive impurity, such as arsenic, is introduced into a surface of the semiconductor substrate 101 in the peripheral circuit region 103 and the memory cell region 104 at $2\times10^{15}$ $cm^{-3}$ using the silicon nitride layer 127 and the third side walls 130A as a mask. Then, a heat treatment is carried out. The n type conductive impurity is diffused by the heat treatment. The heavily doped impurity region 111 is formed by this diffusion, as shown in FIG. 4(D). Also, this heavily doped impurity region 111 can be formed after forming the first side walls 109A in a process described in FIG. 4(A).

As such, MOS transistors having the LDD or Extension structure is formed. In the case of both structures, as the side walls (109A and 130A) for forming the heavily impurity region 111 are thinner, a distance of the lightly doped impurity region 110 is shorter in a horizontal direction. Therefore, the parasitic resistance can be reduced.

Figure 4E:
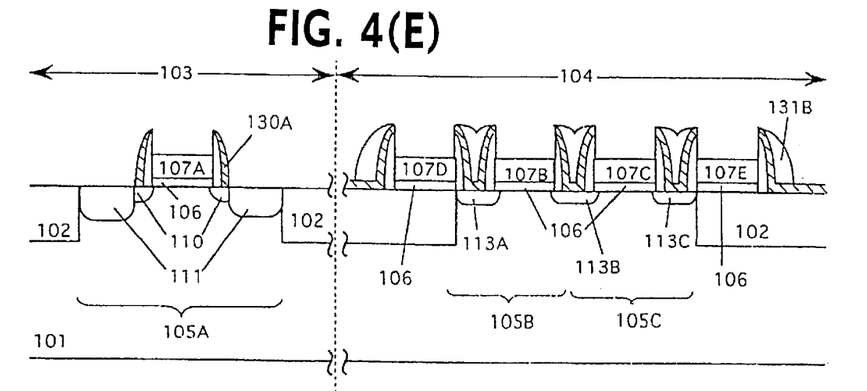
Figure 4F:
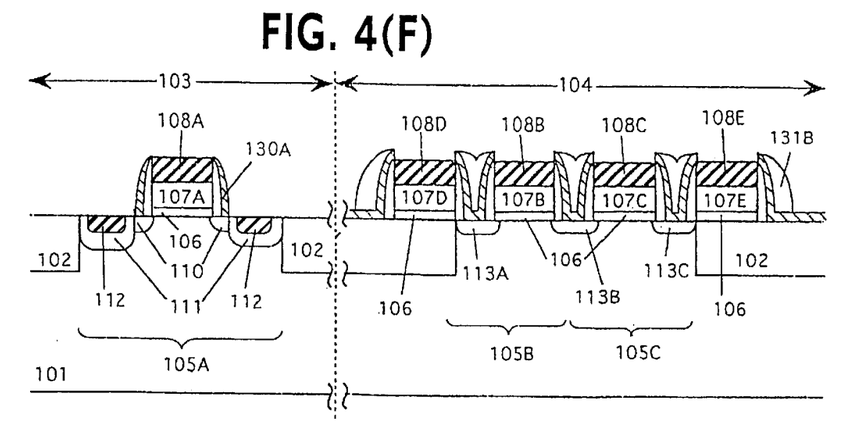

As shown in FIG. 4(E), the silicon nitride layers 127 in the peripheral circuit region 103 and the silicon nitride layer 130 over the polycrystalline silicon layers 107B . . . 107E in the memory cell region 104, are removed by selective etching A refractory metal layer 108, such as a cobalt (Co), titanium (Ti), tungsten (W), is deposited on the semiconductor substrate 101. Here, the refractory metal layer 108 is reacted with the polycrystalline silicon layers 107A . . . 107E and the heavily doped impurity region 111 by a saliside (Self Aligned Silicide) method. The refractory metallic silicide layers 112, 108A . . . 108E, such as $CoSi_2$, $TiSi_2$, $WSi_2$, are formed on the impurity regions 111 and the polycrystalline silicon layers 107A . . . 107E, as shown in FIG. 4(F). Similarly, the impurity regions 113A . . . 113C in the memory cell region 104 do not react with the refractory metal layer 129 since the impurity regions are covered by the side walls.

The refractory metal layer 108 on the first and second side walls 109A, 131B, the insulating layer 102 and the silicon nitride layer 130 does not react by the saliside method and is removed therefrom. Similar to the first preferred embodiment, the bit line, the capacitor, the conductive lines, ect. are formed thereon.

According to the third embodiment, as a thickness of the side walls of the MOS transistor in the peripheral circuit region becomes thinner, a parasitic resistance of the MOS transistor can be reduced. As a result, a peripheral circuit which is capable of a high speed operation and a memory cell which is capable of reducing leakage current and shortening an access time, can be formed.

Figure 5:
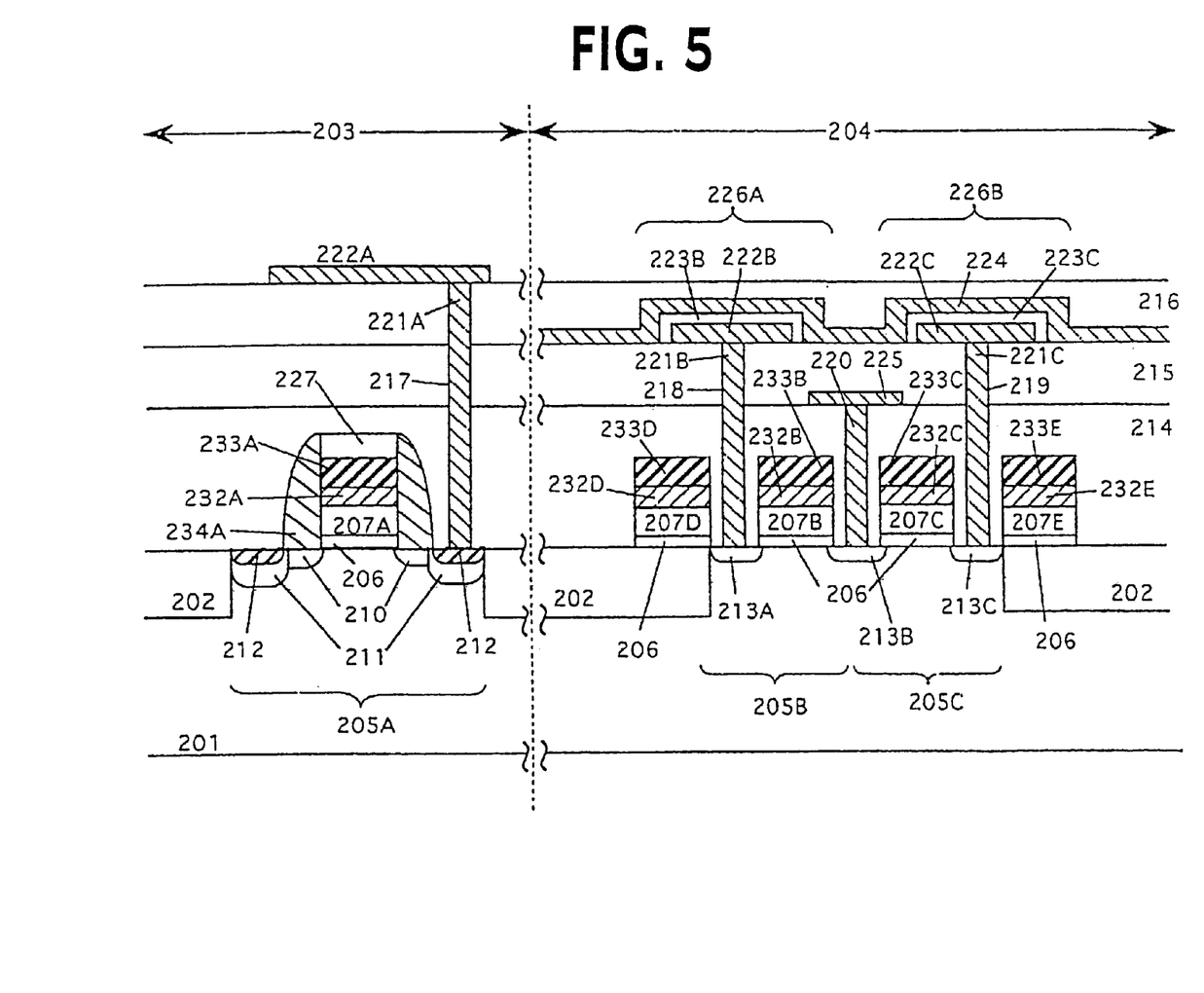
FIG. 5 is a cross-sectional view describing a semiconductor device according to a fourth preferred embodiment.

FIG. 5 is a cross-sectional view describing a semiconductor device according to a fourth preferred embodiment.

A semiconductor substrate 201 having a p type conductivity is comprised of a monocrystal silicon. Insulating layers 202 are formed on a surface of the semiconductor substrate 201. Also, field insulating layers which are formed by a LOCOS (Local Oxidation of Silicon) method can be used as the insulating layers 202. The surface of the semiconductor substrate 201 is divided in a plurality of element regions 203, 204 by the insulating layers 202.

N channel type MOS (NMOS) transistors 205B, 205C which comprise memory cell transistors in memory cells of the DRAM, are formed in the element region 204. A NMOS transistor 205A which controls the transistors in the memory cell, such as the NMOS transistors 205B, 205C, is formed in the element region 203. Here, the element region 203 is defined as a peripheral circuit region and the element region 204 is defined as a memory cell region. Similarly, in the peripheral region 203, plural logic circuits which output linear signals and control the transistors in the memory cell region, are formed therein.

The NMOS transistor 205 in the peripheral circuit region 203 will be described hereinafter. A gate electrode of the NMOS transistor 205 is comprised of a crystalline silicon layer 207A which is doped with an impurity, such as phosphorus, and a refractory metal nitride 232A, such as tungsten nitride (WN), and a refractory metal layer 233A, such as tungsten (W). That is, the gate electrode is a poly-metal structure which includes the refractory metal. A gate oxide layer 206 is formed under the polycrystalline silicon layer 207A.

A source region and a drain region are comprised of an N type impurity region 210 in which is lightly doped, and an N type impurity region 211 in which is heavily doped. Such structure is called a LDD structure. Also, an Extension structure which includes an N type impurity region 210' in which is heavily doped instead of the N type impurity region 210 can be used. The N type impurity region 210' has a shallow junction.

The N type impurity regions 210 (lightly doped region) is formed by ion implantation of phosphorus into the semiconductor substrate 201 at $4 \times 10^{13}$ $cm^{-3}$. The N type impurity regions 211 (heavily doped region) are formed by ion implantation of arsenic into the semiconductor substrate 201 at $2 \times 10^{15}$ $cm^{-3}$.

In the Extension structure, the N type impurity regions 210 are implanted with arsenic into the semiconductor substrate 201 at $4 \times 10^{14}$ $cm^{-3}$. The N type impurity regions 211 are implanted with arsenic into the semiconductor substrate 201 at $2 \times 10^{15}$ $cm^{-3}$.

Refractory metallic silicide layers 212 are formed on surfaces of the source and drain regions. The refractory metallic silicide layer 212 is a silicide layer which is the combination of silicon and a refractory metal, such as cobalt (Co), titanium (Ti) and tungsten (W). In this embodiment, the refractory metallic silicide layer 212 is $CoSi_2$, $TiSi_2$ or $WSi_2$. A side wall 234A which is comprised of a nitride, is formed on the side of the gate electrode for forming the LDD structure. A silicon nitride layer 227 is formed on the refractory metal layer 233A Next, the NMOS transistors 205B and 205c of the memory cells will be described.

Gate electrodes of the NMOS transistors 205B and 205C are respectively comprised of crystalline silicon layers 207B, 207C, refractory metal nitride layers 232B, 232C, such as tungsten nitride (WN), refractory metal layers 233B, 233C, such as tungsten (W). Gate electrodes of the next NMOS transistors are formed on the insulating layer 202 in the vicinity of the gate electrodes of the NMOS transistors 205B and 205C. The gate electrodes of the next NMOS transistors have the same structure of the MOS transistors 205B, 205C. Gate oxide layers 206 are formed under the polycrystalline silicon layer 207B . . . 207E. Impurity regions 213A, 213B and 213C are a source region or a drain region of the NMOS transistors 205B or 205C and these are n type impurity regions. The impurity region 213B is shared with the NMOS transistors 205B and 205C.

These N type impurity regions 213A–213C are formed by an ion implantation of arsenic (As) into the semiconductor substrate 201 at $1 \times 10^{14}$ $cm^{-3}$.

A first intermediate insulating layer 214, a second intermediate insulating layer 215 and a third intermediate insulating layer 216 which are comprised of a silicon oxide, are formed on the peripheral circuit region 203 and the memory cell region 204.

A contact hole 217 is formed in the peripheral circuit region 203. The contact hole 217 goes through the first, second and third intermediate insulating layers 214, 215, 216. That is, the contact hole 217 is formed between the refractory metallic silicide layer 212 of the source or drain region and a surface of the third intermediate insulating layer 216. A buried conductive layer 221A, such as tungsten (W) is filled into the contact hole 217. A conductive line 222A which is connected to the buried conductive layer 221A, is formed on the third intermediate insulating layer 216. The conductive line 222A is connected to another MOS transistors (not shown) in the peripheral circuit region 203.

Contact holes 218, 219 are formed in the memory cell region 204. The contact holes 218, 219 go through the first and second intermediate insulating layers 214 and 215. That is, the contact holes 218, 219 are formed between the source or drain regions 213A, 213C and a surface of the second intermediate insulating layer 215. Further, a contact hole 220 is formed in the memory cell region 204. The contact hole 220 goes through the first intermediate insulating layer 214. That is, the contact hole 220 is formed between the source or drain regions 213B and a surface of the first intermediate insulating layer 214. A conductive layer is filled into the contact hole 220 and is connected to a bit line 225 which is provided data from the memory cell. Buried conductive layers 221B and 221C, such as a polycrystalline layer, are filled into the contact holes 218, 219.

Storage electrodes 222B and 222C which are comprised of polycrystalline, are formed on the second intermediate insulating layer 215 and are respectively connected to the impurity regions 213A, 213C through the buried conductive layers 221B, 221C. Dielectric layers 223B, 223C, such as nitride layers, are formed on the storage electrodes 222B, 222C so as to cover the storage electrodes. Cell plate electrode 224 is formed on the dielectric layers 223B, 223C.

According to the fourth preferred embodiment, as the gate electrodes of the peripheral circuit region and the memory cell region, are comprised of the polymetal structure which includes polycrystalline silicon and refractory metal, resistance of the gate electrodes is reduced and a high speed operation can be realized.

Further, as refractory metallic silicide layers are formed on the source and drain regions of the MOS transistor in the peripheral circuit region, resistance of the source and drain regions is reduced and a peripheral circuit which is capable of a high speed operation is realized.

Moreover, leakage current from the source or drain region to the substrate is reduced and a predetermined data-retention-time can be secured. As a resistance of the gate electrode of the MOS transistor in the memory cell region is reduced by the poly-metal structure, an access time can be shortened.

As the gate electrodes of the memory cell are surrounded by an oxide which has a small stress, as compared with a nitride, leakage current which is caused by the stress, can be reduced.

A method of manufacturing the semiconductor device according to fourth preferred embodiment, will be shown hereinafter referring to FIG. 6(A)–FIG. 6(H). In this embodiment, elements which correspond to the elements mentioned above are marked with the same symbols to facilitate understanding.

Figure 6A:
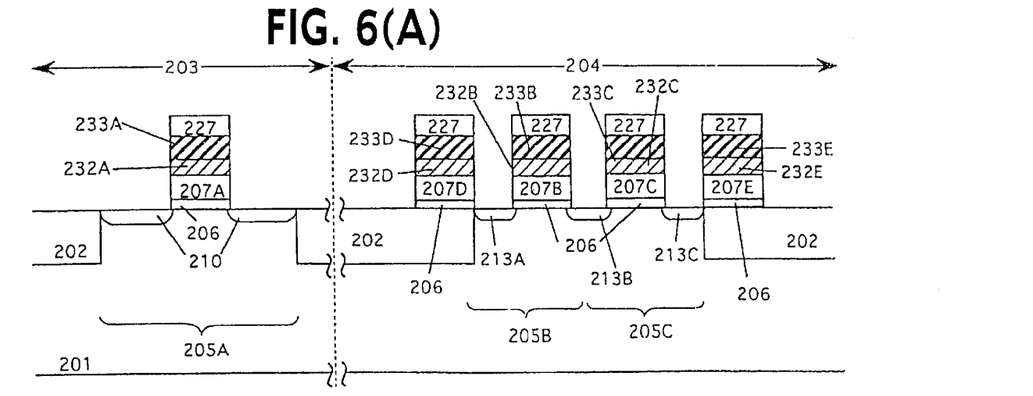
FIG. 6(A)–FIG. 6(H) are cross-sectional views describing a method of manufacturing the semiconductor device shown in FIG. 5.

As shown in FIG. 6(A), insulating layers 202 are formed on a semiconductor substrate 201. Similar to the above embodiment, these insulating layers can be formed by a LOCOS method. Thereby, a surface of the semiconductor substrate 201 is divided as a peripheral circuit region 203 and a memory cell region 204. An oxide layer is formed on the surface of the semiconductor substrate by a thermal treatment. Then, a polycrystalline silicon layer 207, a refractory metal nitride layer 232, such as a tungsten nitride layer (WN), a refractory metal layer 233, such as tungsten layer (W), and a silicon nitride layer 227 are formed on the oxide layer 206. Then, these layers are patterned by a photolithography technique, as shown in FIG. 6(A).

Then, a n type conductive impurity, such as phosphorus, is introduced into the surface of the semiconductor substrate 201 in the peripheral circuit region 203 and the memory cell region 204 at $4 \times 10^{13}$ cm$^{-3}$ using the gate oxide layer 206, the polycrystalline silicon layers 207A . . . 207E, the refractory metal nitride layer 232A . . . 232E, the refractory metal layer 233A . . . 233E and the silicon nitride layer 227 as a mask. Then, a heat treatment is carried out. The n type conductive impurity is diffused by the heat treatment. N type impurity regions 210, 213A . . . 213C are formed by this diffusion. In the case where the NMOS transistor 205 which has the Extension structure is formed, arsenic is introduced into the semiconductor substrate 201 at $4 \times 10^{14}$ cm$^{-3}$.

Figure 6B:
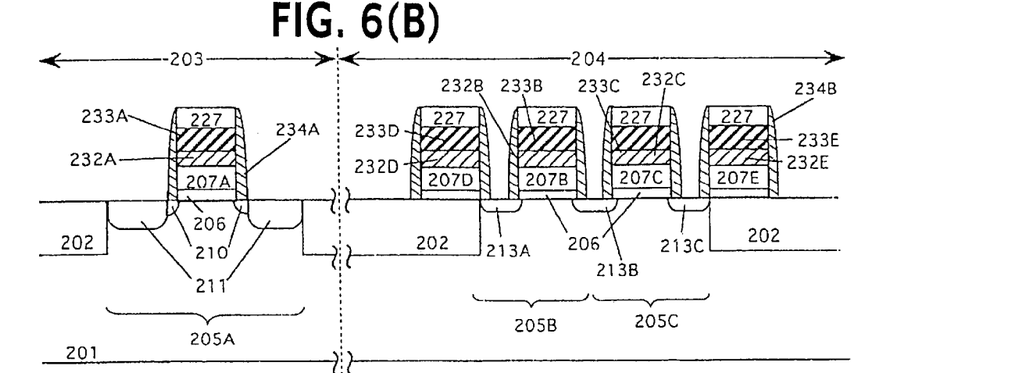

Then, a silicon nitride layer 234 is deposited on the substrate 210. Then, the silicon nitride layer 234 is etched by the anisotropic etching technique and first side walls 234A are formed in the peripheral region and first side walls 234B are formed in the memory cell region, as shown in FIG. 6(B).

Then, an n type conductive impurity, such as arsenic, is introduced into a surface of the semiconductor substrate 201 in the peripheral circuit region 203 at $2 \times 10^{15}$ cm$^{-3}$ using the silicon nitride layer 227 and the first side walls 234B as a mask. Then, a heat treatment is carried out. The n type conductive impurity is diffused by the heat treatment. The heavily doped impurity region 211 is formed by this diffusion, as shown in FIG. 6(B). Thus, the LDD structure which has a lightly doped impurity region and a heavily doped impurity region, can be formed.

Figure 6C:
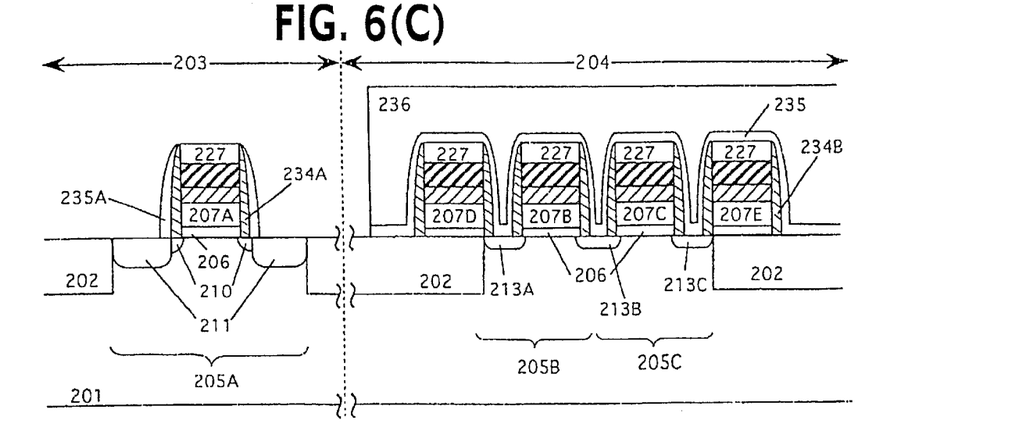

Then, a silicon oxide layer 235 is formed on the substrate 201 at 200 Å. A resist layer 236 is formed on the memory cell region 204 after that. Then, the silicon oxide layer 235 is etched by anisotropic etching and second side walls 235A are formed in the peripheral region, as shown in FIG. 6(C).

The heavily doped impurity region 211 can be formed such that the impurity is diagonally implanted into the sides of the lightly doped impurity region 210. Thereby, the heavily doped impurity region 211 is formed in a deeper position in the substrate 201. As a result, if a refractory metallic silicide layer is formed on the heavily doped impurity region, leakage current is efficiently reduced.

Figure 6D:
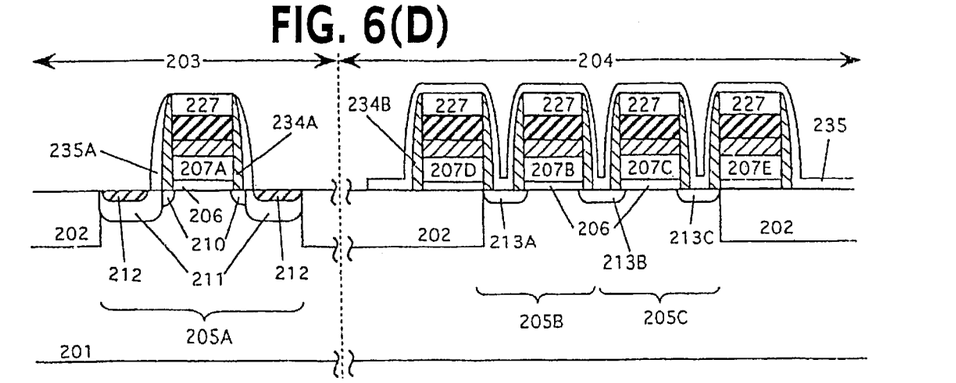

Then, the resist layer 236 is removed and the refractory metal layer, such as cobalt (Co), titanium (Ti), tungsten (W), is deposited on the semiconductor substrate 201. Here, the refractory metal layer is reacted with the heavily doped impurity region 211 by a saliside (Self Aligned Silicide) method, as shown in FIG. 6(D). The refractory metallic silicide layers 212, such as CoSi$_2$, TiSi$_2$ or WSi$_2$, are formed on the impurity regions. The impurity regions 213A . . . 213C in the memory cell region 204 do not react with the refractory metal layer since the impurity regions are covered by the silicon oxide 235. The refractory metal layer on the second side walls 235A, the insulating layer 202 and the silicon nitride layer 227 does not react by the saliside method and is removed therefrom.

Figure 6E:
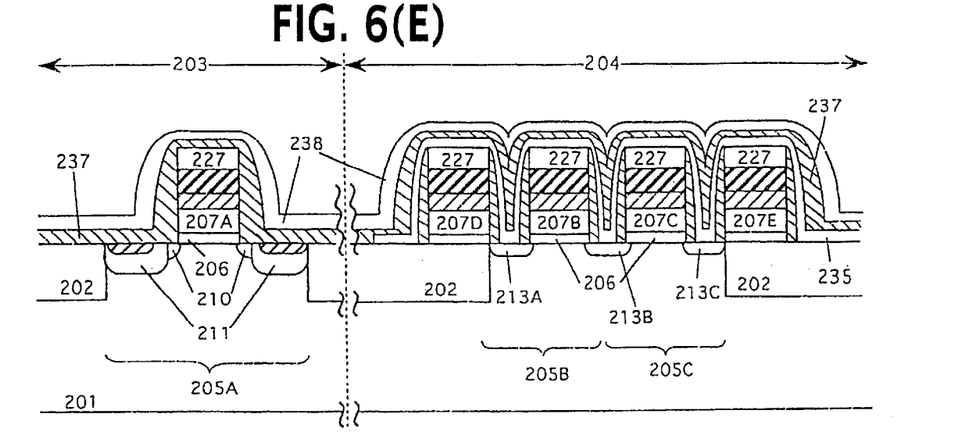

A silicon nitride 237 and a silicon oxide 238 are formed on the substrate 201 at 200 Å, as shown in FIG. 6(E).

Figure 6F:
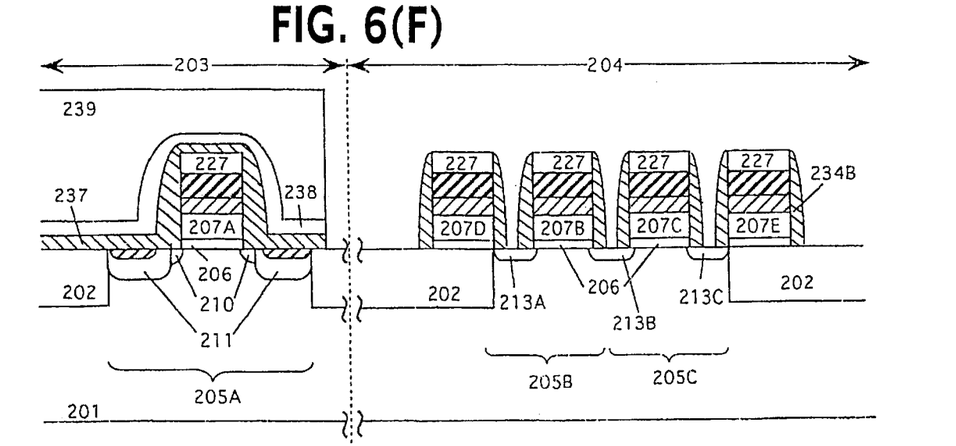

A resist layer 239 is formed on the silicon oxide layer 238 in the peripheral region, as shown in FIG. 6(F). Then, the silicon oxide layer 238, the silicon nitride layer 237 and the silicon oxide layer 235 are respectively removed by a dry etching technique using the resist layer 239 as a mask. As thickness of the silicon oxide layer 238, the silicon nitride layer 237 and the silicon oxide layer 235 are 200 Å, it is easy to remove these layers by dry etching. As a result, the first side walls 234B in the memory cell region 204 are exposed, as shown in FIG. 6(F).

Figure 6G:
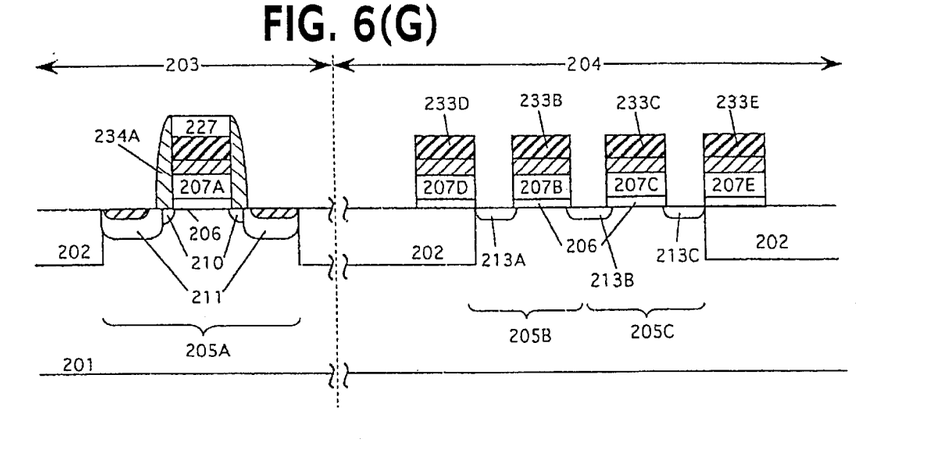

Then, the silicon nitride 227 and the first side walls 234B (silicon nitride) are etched using a thermal phosphoric acid for 60 minutes and these layers are removed, as shown in FIG. 6(G). As a result, a silicon nitride layer which has a large stress, is removed from the gate electrodes of the MOS transistors in the memory cell region. The side walls 234A in the peripheral circuit region are exposed by this etching.

Figure 6H:
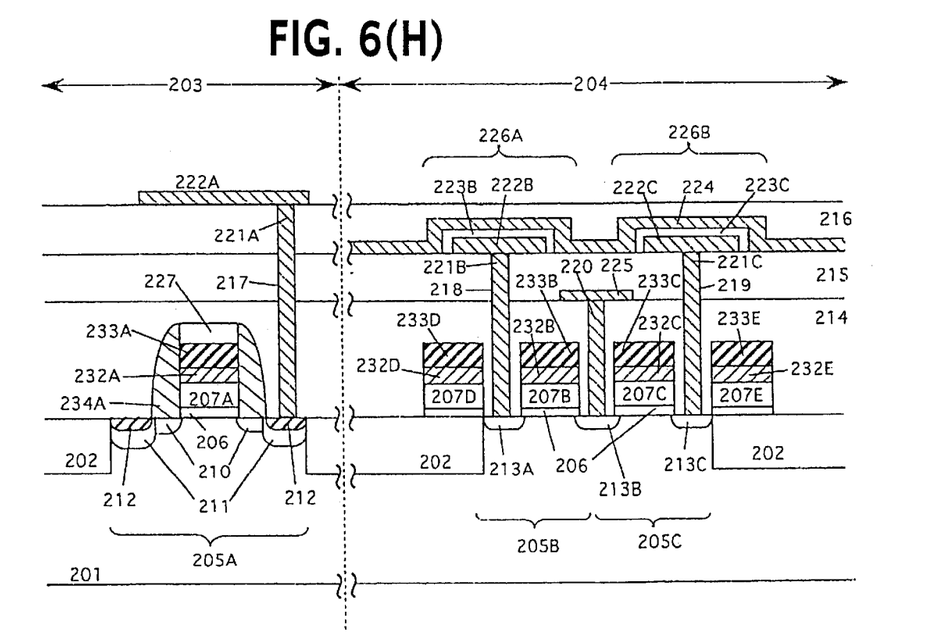

Similar to the first preferred embodiment, a bit line, a capacitor, conductive lines and passivating film etc. are formed thereon, as shown in FIG. 6(H).

According to this manufacturing method, a refractory metallic silicide layer is formed on the impurity region in the peripheral circuit region after covering the impurity region in the memory cell region by the silicon oxide layer, Therefore, the refractory metallic silicide layers can be formed on the source regions and the drain regions of the MOS transistors in the peripheral circuit region with forming the metallic silicide layers on the impurity region in the memory cell region. As a result, a semiconductor device including a peripheral circuit which is capable of a high speed operation and a memory cell which is capable of reducing leakage current and shortening an access time, can be realized.

As the gate electrodes of the peripheral circuit region and the memory cell region are comprised of the poly-metal structure which includes polycrystalline silicon and refractory metal, the resistance of the gate electrodes is reduced and a high speed operation can be realized.

Further, as refractory metallic silicide layers are formed on the source and drain regions of the MOS transistor in the peripheral circuit region, the resistance of the source and drain regions is reduced and a peripheral circuit which is capable of a high speed operation is realized.

Moreover, leakage current from the source or drain region to the substrate is reduced and a predetermined data-retention-time can be secured. As a resistance of the gate electrode of the MOS transistor in the memory cell region is reduced by the poly-metal structure, an access time can be shortened.

As the gate electrodes of the memory cell are surrounded by an oxide which has a small stress, as compared with a nitride, leakage current which is caused by the stress, can be reduced.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A semiconductor device comprising:
   a semiconductor base having a principal surface;
   a first memory cell which is formed on the principal surface and is comprised of a first capacitor and a first MOS transistor, wherein the first MOS transistor has a source region, a drain region and a gate electrode;
   a second memory cell which is formed on the principal surface and is comprised of a second capacitor and a second MOS transistor, wherein the second MOS transistor is formed in a vicinity of the first MOS transistor and has a source region, a drain region and a gate electrode, and wherein one of the source and drain regions of the first MOS transistor and one of the source and drain regions of the second MOS transistor is a shared region,
   wherein the shared region is connected to a bit line through which data is read out from the first and second memory cells, another one of the source and drain regions of the first MOS transistor is connected to the first capacitor, and another one of the source and drain regions of the second MOS transistor is connected to the second capacitor; and
   a peripheral circuit which is formed on the principal surface and includes a third MOS transistor and which controls the first and second memory cells, wherein the third MOS transistor has a source region, a drain region and a gate electrode,
   wherein the source region, the drain region and the gate electrode of the third MOS transistor are comprised of refractory metallic silicide, the gate electrodes of the first and second MOS transistors are comprised of refractory metallic silicide, and the source and drain regions of the first and second MOS transistors are not comprised of refractory metallic silicide.

2. The semiconductor device according to claim 1, wherein the gate electrodes of the first, second, and third MOS transistors are comprised of stacked layers which include a polycrystalline silicon layer and a refractory metallic silicide layer.

3. The semiconductor device according to claim 2, wherein the stacked layers are formed on the semiconductor base through a gate insulating layer, and wherein an upper layer of the stacked layers is the refractory metallic silicide layer and a lower layer of the stacked layers is the polycrystalline silicon layer.

4. The semiconductor device according to claim 3, wherein the refractory metallic silicide layer is a cobalt silicide layer, a titanium silicide layer or a tungsten silicide layer.

5. The semiconductor device according to claim 1, wherein the source and drain regions of the first and second MOS transistors are smaller than those of the third transistor.

6. The semiconductor device according to claim 1, wherein the first and second capacitors are formed in a first layer and the bit line is formed in a second layer, wherein the first layer is above the second layer.

7. A semiconductor device comprising:
   a semiconductor base having a principal surface;
   a memory cell which is formed on the principal surface and is comprised of a capacitor and a first MOS transistor, wherein the first MOS transistor has a source region, a drain region and a gate electrode; and
   a peripheral circuit which is formed on the principal surface and includes a second MOS transistor and which controls the memory cell, wherein the second MOS transistor has a source region, a drain region and a gate electrode,
   wherein the gate electrodes of the first and second MOS transistors are each comprised of a polycrystalline silicon, a first refractory metal, and a compound layer of the first refractory metal and nitrogen, wherein the compound layer is sandwiched between the polycrystalline silicon and the first refractory metal, and
   wherein the source and drain regions of the second MOS transistor are comprised of a silicide of a second refractory metal and the source and drain regions of the first MOS transistor does not include the first and second refractory metals.

8. The semiconductor device according to claim 7, wherein the first and second metals are a same metal.

9. The semiconductor device according to claim 7, wherein the first refractory metal is tungsten and the second refractory metal is cobalt, titanium or tungsten.

10. The semiconductor device according to claim 1, wherein the source and drain regions of the third MOS transistor each have a lightly doped drain (LDD) structure.

11. The semiconductor device according to claim 7, wherein the source and drain regions of the second MOS transistor each have a lightly doped drain (LDD) structure.

* * * * *